United States Patent [19]
Hori

[11] Patent Number: 5,403,786
[45] Date of Patent: Apr. 4, 1995

[54] SEMICONDUCTOR DEVICE AND METHOD FOR FABRICATING THE SAME

[75] Inventor: Takashi Hori, Takatsuki, Japan

[73] Assignee: Matsushita Electric Industrial Co., Ltd., Japan

[21] Appl. No.: 251,642

[22] Filed: May 31, 1994

Related U.S. Application Data

[63] Continuation of Ser. No. 226,848, Aug. 1, 1988, abandoned.

[30] Foreign Application Priority Data

Jul. 31, 1987 [JP] Japan .................. 62-192917
Jul. 7, 1988 [JP] Japan .................. 63-169407

[51] Int. Cl.⁶ ............................. H01L 21/283
[52] U.S. Cl. .................. 437/238; 437/239; 437/241; 437/942
[58] Field of Search ........... 437/235, 238, 239, 241, 437/242, 942; 148/DIG. 114, DIG. 156, DIG. 118

[56] References Cited

U.S. PATENT DOCUMENTS 5,198,392  3/1993  Fukuda et al. ................ 437/241

OTHER PUBLICATIONS

Hori et al., "Improvement of Dielectric Strength of TiSi$_x$-Polycide-Gate System by Using Rapidly Nitrided Oxides", IEEE VLSI Symp. Tech. Dig., 1987, pp. 63-64.

Hori et al., "Correlation Between Electron Trap Density and Hydrogen Concentration in Ultrathin Rapidly Reoxidized Nitrided Oxides", Appl. Phys. Lett., vol. 52, No. 9, 29 Feb. 1988, pp. 736-738.

Hori et al., "Ultra-Thin Re-Oxidized Nitrided-Oxides Prepared by Rapid Thermal Processing", IEDM 1987, Dec. 1987, Paper No. 26.2, pp. 570-573.

Hori et al., "Excellent Charge-Trapping Properties of Ultrathin Reoxidized Nitrided Oxides Prepared by Rapid Thermal Processing", IEEE Electron Device Letts. vol. 9, No. 4, Apr. 1988, pp. 168-170.

Lai et al., "Electrical Properties of Nitrided-Oxide Systems for Use in Gate Dielectrics and EEPROM", IEDM 1983, Dec. 1983, Paper No. 8.4, pp. 190-193.

Yankova et al., "Effects of Thermal Nitridation on the Trapping Characteristics of SiO$_2$ Films", Solid-State Electronics, vol. 30, No. 9, pp. 939-946, 1987.

Wu et al., "Rapid Thermal Nitridation and Reoxidation of Thin Thermal Oxide", Ext. Abs. vol. 88-1, Electrochem. Soc., may 15-20, 1988, pp. 96-97.

Shih et al., "Reliable Thin Oxide/Nitride/Oxide (ONO) Films Produced by Multiple Rapid Thermal Processing", Ext. Abs. vol. 88-1, Electrochem. Soc., may 15-20, 1988, pp. 83-84.

(List continued on next page.)

Primary Examiner—Mary Wilczewski
Attorney, Agent, or Firm—Wenderoth, Lind & Ponack

[57] ABSTRACT

Disclosed are a semiconductor device possessing an insulating film which is a silicon oxide film containing nitrogen formed on a semiconductor substrate, with the hydrogen concentration ([H]) in this oxide film satisfying the condition of $$\left(\frac{[H]}{[H_{ox}]}\right)^m \leq 1 + K[N]^n$$

where m≈2.0±0.4, n≈2.5±0.5 k≈2.0±0.4 (at. %)$^{-2}$
[H$_{ox}$]: hydrogen concentration in an ordinary thermally grown silicon oxide film
[N]: concentration of nitrogen contained in the interface of oxide film and substrate; and a method for fabricating a semiconductor device comprising the steps of forming a nitrided oxide silicon film by nitrizing a thermally grown silicon oxide film formed on a semiconductor substrate in a nitrizing atmosphere by using a rapid heating furnace, reannealing it in an oxidizing or inert gas atmosphere by using a rapid heating furnace to form a reannealed nitrided oxide insulating film, and forming a gate electrode.

12 Claims, 8 Drawing Sheets

OTHER PUBLICATIONS

Shih et al, "Short-Channel MOSFETs' With Superior Gate Dielectrics Fabricated Usig Multiple Rapid Thermal Processing", IEEE Trans on Electron Devices, vol. 35, No. 12, Dec. 1988, p. 2438.

Wright et a l., "Electrical Characteristics and Irradiation Sensitivity of IGFET's With Rapidly Grown Ultrathin Gate Dielectrics" IEEE Trans. on Electron Devices, vol. 35, No. 12, Dec. 1988, pp. 2438–2439.

Moslehi, "Rapid Thermal/Plasma Processing for In-Situ Dielectric Engineering" in *Rapid Thermal Processing of Electronic Materials*, Wilson, Syd R.; Ronald Powell and D. Eirug Davies, eds., Mat. Res. Soc., 1987, pp. 73–87.

Moslehi et al., "Rapid Thermal Nitridation of $SiO_2$ for Nitroxide Thin Dielectrics", Appl. Phys. Lett., vol. 47, No. 10, 15 Nov. 1985, pp. 1113–1115.

Nulman et al., "Rapid Thermal Nitridation of Thin Thermal Silicon Dioxide Films", Appl. Phys. Lett., vol. 47, No. 2, 15 Jul. 1985, pp. 148–150.

Hori et al., "Interface States and Fixed Charges in Nanometer-Range Thin Nitrided Oxides Prepared by Rapid Thermal Annealing", IEEE Electron Device Letters, vol. EDL-7, No. 12, Dec. 1986, pp. 669–671.

Hori et al., "Electrical and Physical Characteristics of Thin Nitrided Oxides Prepared by Rapid Thermal Nitridation", IEEE Trans on Electron Devices, vol. ED-34, No. 11, Nov. 1987, pp. 2238–2245.

Nulman, "Rapid Thermal Processing for Thin Silicon Dielectrics: Growth and Applications", Ext. Abs. vol. 88-1, Electrochem. Soc., May 15–20, 1988 p. 91.

Chang et al., "Effects of Rapid Thermal Oxidation on Deposited Nitride/Oxide Layer", Ext. Abs. vol. 88-1, Electrochem. Soc., May 15–20, 1988, pp. 89–90.

Dunham et al., "Rapid Thermal Oxidation—Trends in Thin Oxide Growth Kinetics", Ext. Abs. vol. 88-1, Electrochem. Soc., May 15–20, 1988, pp. 92–93.

Sundaresan et al., "Rapid Thermal Nitridation of $SiO_2$ for Radiaiton-hardened MOS Gate Dielectrics", IEEE Trans., Dec. 1986, pp. 1223–1226.

Moslehi et al., "Thin $SiO_2$ Insulators Grown by Rapid Thermal Oxidation of Silicon", Appl. Phys. Lett., vol. 47, No. 12, 15 Dec. 1985, pp. 1353–1355.

Lai et al., "Reduction of Electron Trapping in Silicon Dioxide by High-Temperature Nitrogen Anneal", J. Appl. Physics, vol. 52, No. 9, Sep. 1981, pp. 5691–5695.

Lai et al., "Effects of Ammonia Anneal on Electron Trappings in Silicon Dioxide", J. Electrochem. Soc., vol. 129, No. 9, Sep. 1982, pp. 2042–2044.

SEMICONDUCTOR DEVICE AND METHOD FOR FABRICATING THE SAME

This application is a continuation of application Ser. No. 07/226,848, filed Aug. 1, 1988, now abandoned.

BACKGROUND OF THE INVENTION

This invention relates to a semiconductor device, more particularly to a semiconductor device possessing an insulating film of high quality and the method for fabricating the same.

Conventionally, thermally oxidized films and nitrided oxide films formed on a semiconductor substrate were used as the gate oxide film for an MOS type semiconductor device or tunnel oxide film for an EEPROM semiconductor device.

In the gate insulation film of the conventional structure, however, hot carriers generated in the high electric field region due to the recent microminiaturization of semiconductors are injected into the gate insulating film. As a result of this injection, a shift of flat-band voltage and deterioration of electric characteristics due to an increase of interface state density are caused, in particular, fluctuations of threshold voltage occur in the ordinary superfine MOS, and fluctuations of potential beneath the gate in the writing state of signal "1" and in non-writing state are experienced in the EEPROM, which presents serious problem in the setting of operation margins or reliability of the device.

To solve these problems and also to obtain stabler gate insulating films, it has been attempted among some researchers to use nitrided oxide films instead of thermally oxidized ones, but practical materials have not been developed yet.

SUMMARY OF THE INVENTION

This invention is devised in the light of the above-discussed problems, and it is hence a primary object of this invention to present a semiconductor device possessing an insulating film which is stabler and applicable to gate insulating film of submicron MOS or the like, and the method for fabricating the same, by a completely new approach, by searching for the intrinsic causes of the shift of flat-band voltage of gate insulating film by hot carrier injection and increase of interface state density.

This and other objects are accomplished by a semiconductor device possessing a silicon oxide film containing nitrogen, being formed on a semiconductor substrate, of which hydrogen concentration ([H]) satisfies the following condition:

$$\left(\frac{[H]}{[H_{ox}]}\right)^m \leq 1 + K[N]^n$$

where $m \approx 2 \pm 0.4$, $n \approx 2.5 \pm 0.5$, $k \approx 2.0 \pm 0.4$ (at. %)$^{-2}$ [$H_{ox}$] is hydrogen concentration in an ordinary thermally grown oxide film [N] is concentration of nitrogen contained in the film-substrate interface.

This invention also presents a method for fabricating a semiconductor device comprising the steps of forming a nitrided oxide film by heating a silicon oxide film formed on a semiconductor substrate in a nitrizing atmosphere in a short time by using a heating furnace, reheating in an oxidizing or inert gas atmosphere for a short time by using a heating furnace to form a reannealed nitrided oxide insulating film, and forming a gate electrode.

Accordingly this invention presents a semiconductor device possessing a highly reliable insulating film of reannealed nitrided oxide film low in hydrogen content and small in charge trapping density, and the method of fabricating the same, by using a heating furnace for a short time.

This invention provides various advantages, among which are as follows.

According to this invention, a reannealed nitrided oxide film restricting redistribution of impurities and possessing a low charge trapping density can be obtained at an extremely simple method, and in a ultrafine MOS type semiconductor device, deterioration of electric characteristics induced by hot carriers can be extremely inhibited. Besides, in an EEPROM semiconductor device, the number of reloadable times can be notably improved, and it is hence very useful practically.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
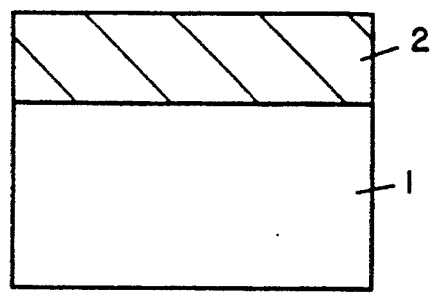
FIGS. 1A–1C are drawings of a method of fabricating a semiconductor device according to one of the embodiments of this invention.
Figure 1:
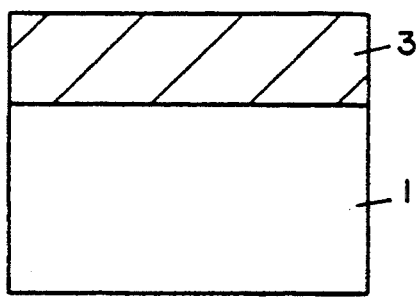
Figure 1:
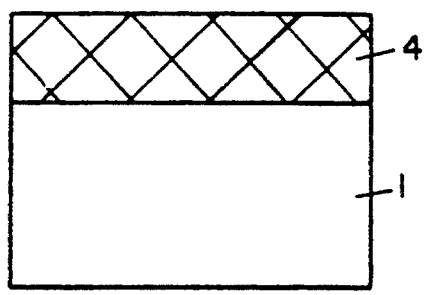

Referring now to FIGS. 1A to 1C, one of the embodiments of the fabricating method for the semiconductor device of this invention is described below. A thermally oxidized film 2 is formed on a semiconductor substrate 1. Later, using a lamp heating furnace, a nitrided oxide film 3 is formed by heating in a short time in an ammonia atmosphere. Subsequently, in an oxidizing or inert gas atmosphere, it is heated for a short time by using a lamp heating furnace and a reannealed nitrided oxide film 4 is formed.

Thereafter, the process of reaching the investigation of the fabricating method of this semiconductor device, its results and effects are explained in detail below, on the basis of the experimental results, in particular relating to the two processes of reannealing in oxidizing gas the nitride film formation by annealing furnace in a short time which is the feature of this invention.

Generally, to begin with, concerning the conventional formation of the nitride film, it was formed by nitrizing in an electric quartz-tube furnace or the like in a long time, in a nitrizing atmosphere such as ammonia. In this respect, although not clearly, various problems such as leak considered to be derived from entry of large amount of hydrogen into insulating film come to be indicated.

Figure 2:
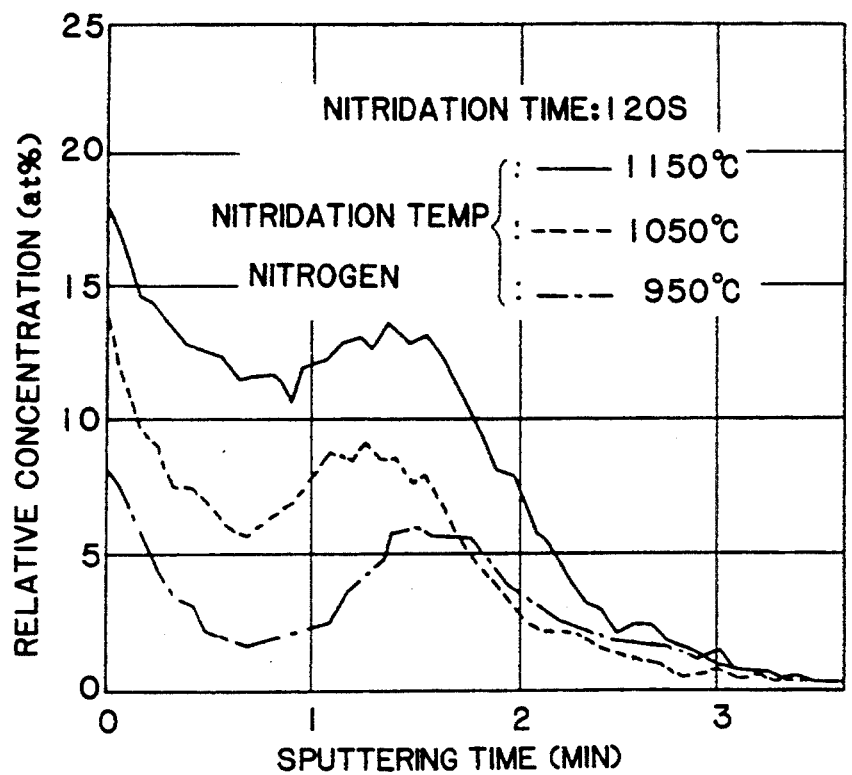
FIG. 2 is a distribution diagram of nitrogen in an nitrided oxide film evaluated by Auger's spectral method.

Therefore, experimentation on nitridation of oxide film was conducted by using a short-time annealing furnace in which the annealing time is controllable in a unit of seconds which is employed generally. As a result, the distribution of nitrogen contained in the fabricated nitrided oxide films was as shown in FIG. 2. This is the result of analysis by Auger's spectral method of the distribution of nitrogen in the depthwise direction by nitrizing for 120 seconds at 1150° C., 1050° C., and 950° C. in which a nitrided oxide film is formed near the surface and near the insulating film/semiconductor substrate interface, and the nitrogen concentration is increasing as the nitridation temperature goes up. Generally, the nitrided oxide film formed near the semiconductor substrate interface is considered to be effective for reducing the interface state which is induced when electrons are injected into the insulating film.

Figure 3:
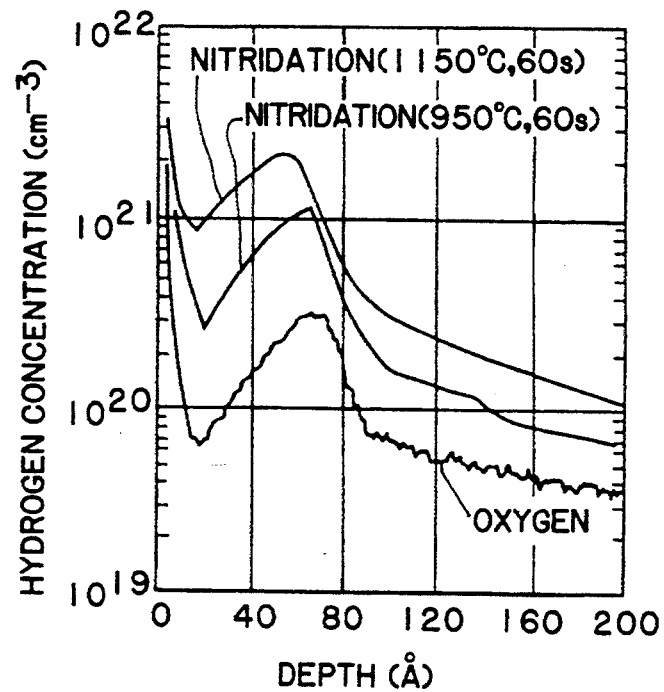
FIG. 3 is a distribution diagram of hydrogen in an oxide film and nitrided oxide film evaluated by SIMS.

On the other hand, FIG. 3 shows the hydrogen profile in the nitrided oxide films evaluated according to the secondary ion mass spectroscopy (SIMS), relating to nitrided oxide films nitrided for 60 seconds at 950° C. and 1150° C. (NO and $NO_{HT}$, respectively), and thermally oxidized film. As the nitridation temperature goes up, it is evident that the hydrogen concentration in the nitrided oxided film increases extremely.

Here, in order to clarify the relation between hydrogen concentration and film quality, in particular, the electron trapping charge density, it was evaluated by the constant current stress method which is a conventional method of applying a tunnel current of 10 $mA/cm^2$ to insulating film.

According to the valuation by this constant current stress method, a constant current stress is applied to an insulating film for a specified time, and the induced increment of interface state density and shift of flat-band voltage are evaluated on the basis of the C-V characteristic of the MOS capacitor.

Figure 4:
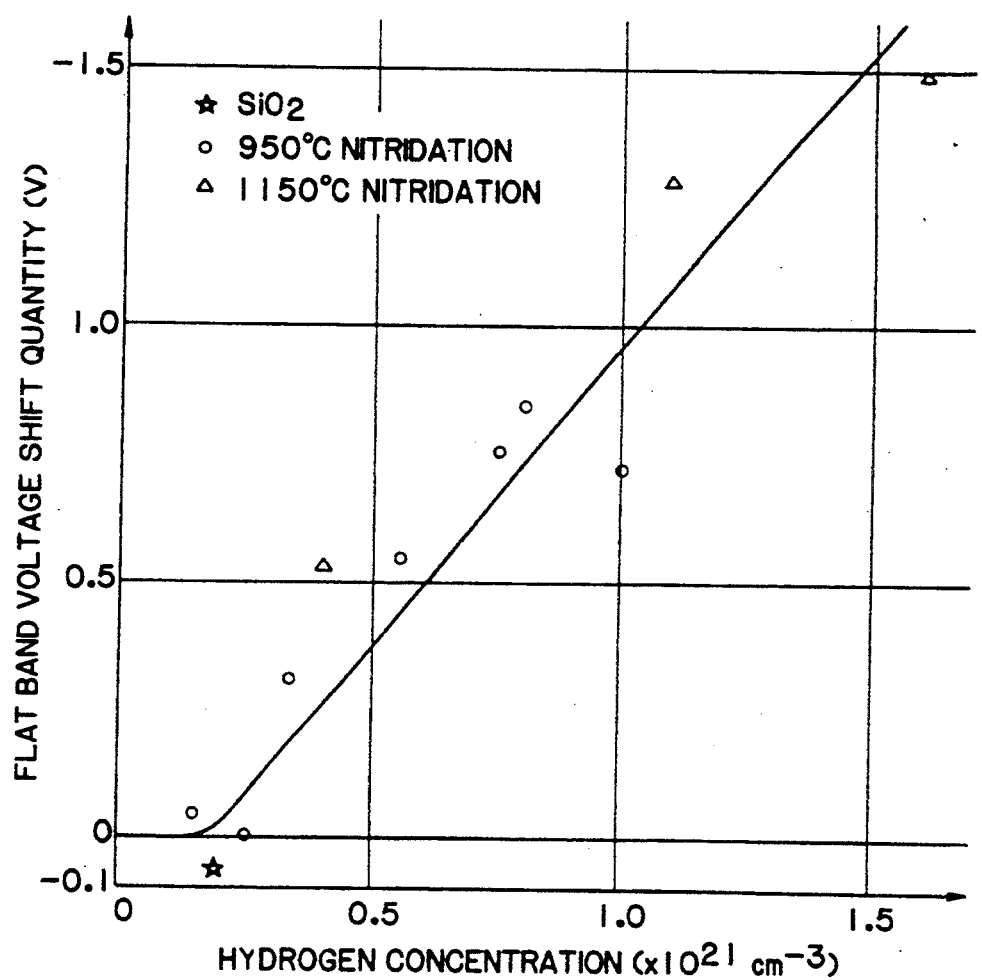
FIG. 4 is a characteristic diagram plotting the shift of flat-band voltage when electrons of 0.1 coulomb/cm$^2$ in various nitrided oxides and reoxidized films are injected into the insulation film, in terms of the hydrogen content in the insulating film as evaluated by SIMS.

First, the hydrogen concentration contained in the film and the shift of flat-band voltage are evaluated in FIG. 4. This is a plotting of the shift of flat-band voltage when electrons of 0.1 coulomb/$cm^2$ are injected into various oxide films, nitrided oxide films, and their reoxidized films, and the hydrogen content in the insulating film evaluated by SIMS.

In the case of oxide film, a negative shift of flat-band voltage was noted because of extreme generation of the interface state.

When the oxide film was treated in an annealing furnace for a short time to form a nitrided oxide film and it was further reoxidized for a short time at various temperatures, as the hydrogen concentration decreases, it was found that the shift of flat-band voltage decreased almost linearly. This is considered because the hydrogen concentration in the nitrided oxide film decreases due to reoxidation, and the electron trapping density decreases proportionally, and the shift of flat-band voltage is decreased.

Figure 5:
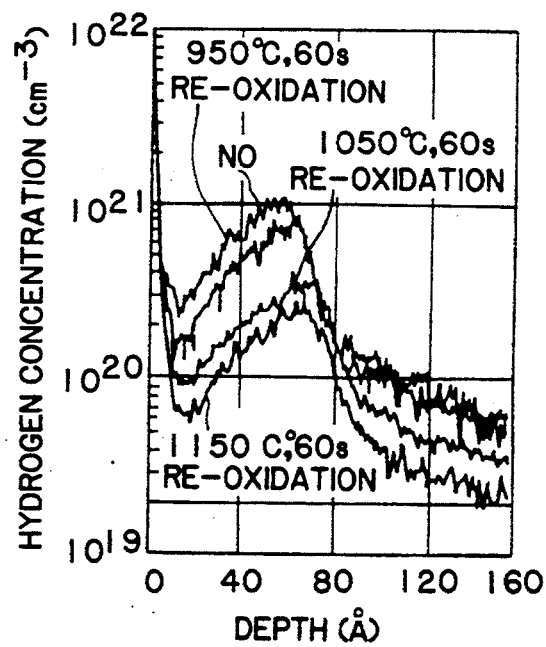
FIG. 5 is a distribution diagram of hydrogen in reoxidized film evaluated by SIMS.

The hydrogen concentration by this reoxidation is evaluated by SIMS in FIG. 5. Nitrided films (NO) and NO nitrided at 950° C. for 60 seconds were reoxidized at 950° C., 1050° C., and 1150° C. for 60 seconds, and the hydrogen concentration profile of these reoxidized films is shown. As the reoxidation is promoted, it is evident that the hydrogen concentration in the insulating film decreases extremely until lowered to be equal to or lower than that of thermally grown oxide film.

Thus, reoxidation is effective significantly for decrease of hydrogen concentration in the insulating film. Therefore, it has been clarified that the content of hydrogen by nitridation contributes greatly to the shift of flat-band voltage by injection of electric charge. Besides, by further reoxidizing this nitrided oxide film in a annealing furnace or the like for a short time, it has been also found that the undesired hydrogen can be taken out very efficiently.

Figure 6:
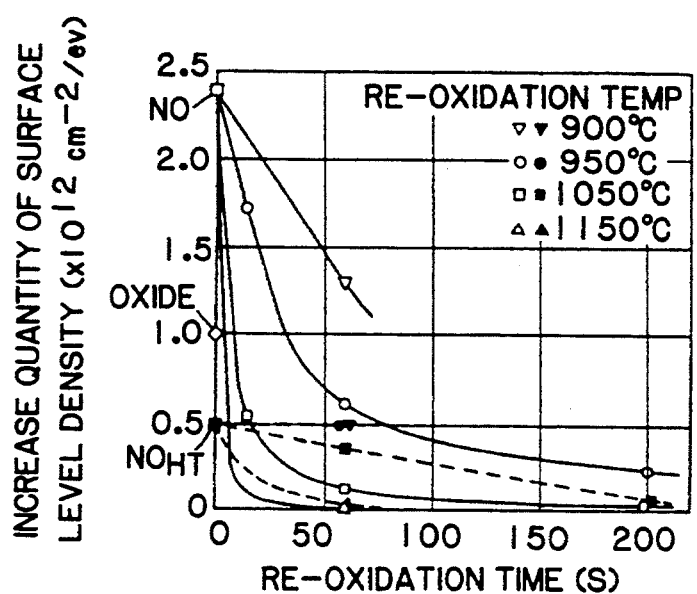
FIGS. 6A and 6B are characteristic diagrams plotting the increment of interface state density and shift of flat-band voltage when electrons of 0.1 coulomb/cm$^2$ are injected into insulating film, in terms of reoxidation time.
Figure 6:
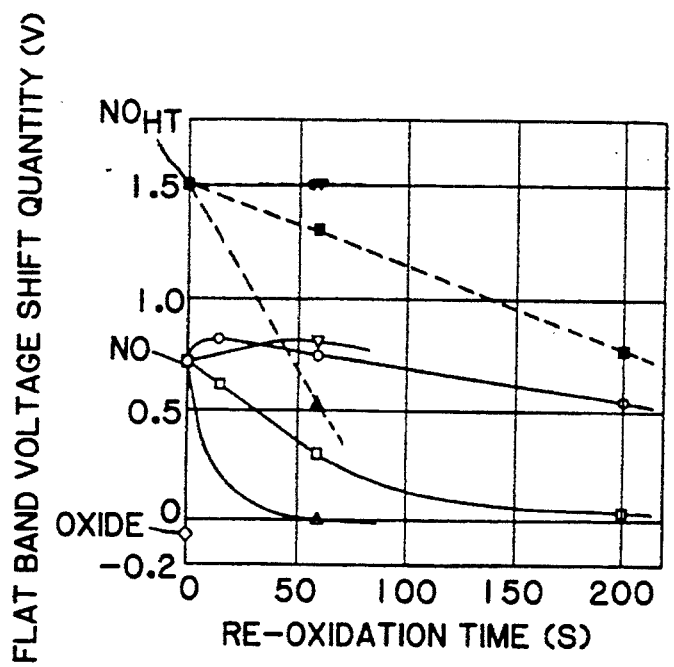

A further experiment was conducted in order to study the process in detail, the results of which are shown in FIG. 6. This diagram is a plot of increment of interface state density and shift of flat-band voltage when electrons of 0.1 coulomb/$cm^2$ are injected into the insulating film, in terms of reoxidation time.

The thickness of insulating film was about 8 nm, and in the case of the conventional oxide films (Oxide) and nitrided oxide films (NO, $NO_{HT}$), initially, the increment of interface state density and shift of flat-band voltage were great.

On the other hand, when the nitrided oxide films (NO, $NO_{HT}$) were reoxidized, as the reoxidation temperature became higher or as the reoxidation time became longer, the increment of interface state density and shift of flat-band voltage both decreased extremely. This effect has been found to be more obvious when the degree of nitridation of nitrided oxide film for reoxidation is smaller.

In particular, when the nitrided oxide film (NO) nitrided for a short time of 60 seconds at 950° C. was reoxidized for 200 seconds at 1050° C. or 60 seconds at 1150° C., the absolute values of both increment of interface state density and shift of flat-band voltage were reduced by about 2 or 3 digits as compared with those of the conventional thermally grown oxide films.

Hence, to treat the thermally oxidized film by nitrizing and reoxidizing for a short time by using a lamp-heated furnace has been known to be extremely effective for obtaining a reoxidized nitrided oxide film possessing a low electron trapping density. That is, only by the fabricating method of semiconductor device of this invention, it is possible, in a small MOS type semiconductor device, to satisfactorily inhibit the deterioration of electron characteristics due to shift of flat-band voltage and increase of interface state density induced by a hot carrier, while maintaining favorable initial characteristics.

Furthermore, as shown in FIG. 6, when the degree of nitridation of the nitrided oxide film for reoxidation is smaller (NO), the shift of flat-band voltage and increment of interface state density are smaller as compared with the greater degree of nitridation ($NO_{HT}$), and it corresponds very well with the fact that the hydrogen content in the nitrided oxide film is smaller than the degree of nitridation, as shown in FIG. 4.

Hence, by reoxidizing the nitrided oxide film which was nitrided for a short time at low temperature as superficially as possible so as not to take in the hydrogen when nitriding the thermally grown oxide film, the reoxidation temperature and reoxidation time may be smaller by the portion of the smallness of the original hydrogen content, so that better characteristics may be expected by treatment in a shorter time.

Meanwhile, that the reoxidized nitrided oxide film is better than the ordinary thermally grown oxide film in characteristics seems to be because of the inhibiting effect of generation of interface state as the nitrided oxide film is formed in the vicinity of the interface of nitrided oxide film and semiconductor substrate as shown in FIG. 2.

Figure 7:
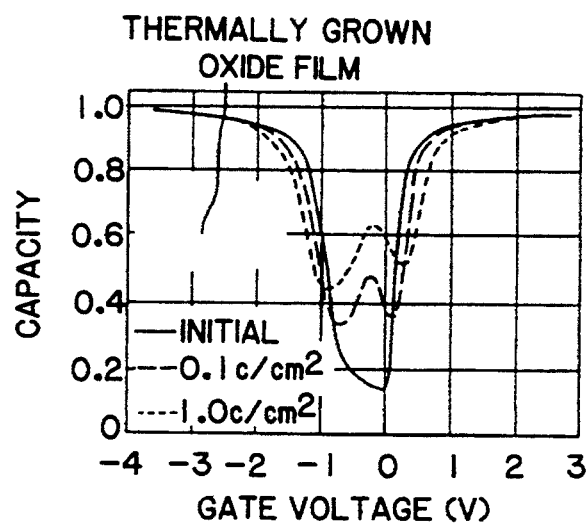
FIGS. 7A–7C are characteristic diagrams showing the changes in C-V characteristic when electrons are injected into the insulating film.
Figure 7:
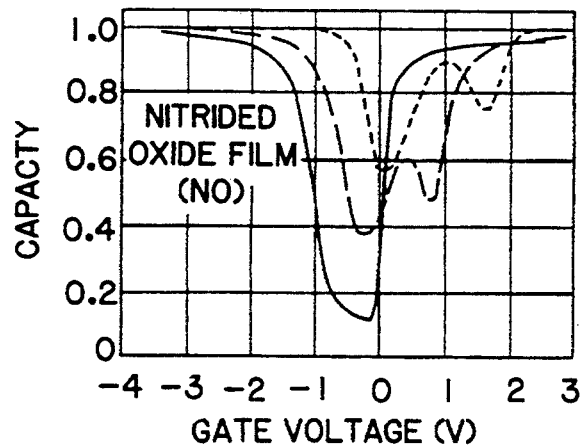
Figure 7:
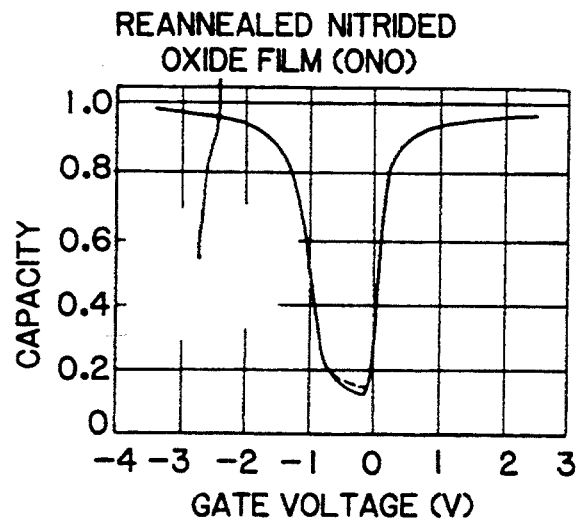

FIG. 7 shows the changes in C-V characteristics when electrons were injected into the insulating film, relating to a thermally grown oxide film, a nitrided oxide film (NO) nitrided for 60 seconds at 950° C., and reoxidized nitrided oxide film (ONO) reoxidized for 60 seconds at 1150° C. from this nitrided oxide film.

In the thermally grown oxide film, very large strain and shift were noted in the C-V characteristics after injection of electrons, while in the reoxidized film (ONO) the C-V characteristics were hardly changed. Thus, nitridation and reoxidation treatment by using lamp-heated furnace is very effective for reduction of increase of interface state density and shift of flat-band voltage generated by injection of electrons.

In other words, by the steps of short-time nitridation of thermally grown oxide film and short-time reoxidation, it is possible to obtain a favorable insulating film possessing lower electron trapping density and free from re-distribution of impurities not experienced in the past.

Figure 8:
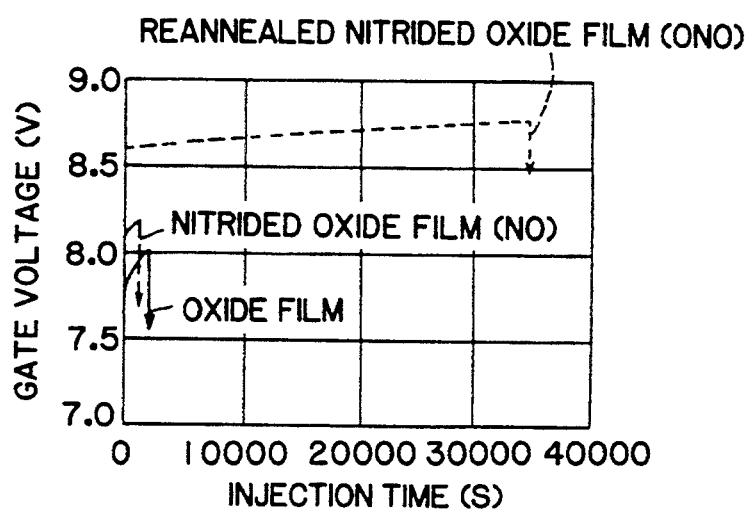
FIG. 8 is a characteristic diagram plotting the gate voltage necessary for injecting electrons of 10 mA/cm$^2$ into the insulating film, with respect to injection time.

Furthermore, FIG. 8 shows the gate voltage necessary for injecting electrons of 10 mA/cm$^2$ into the insulating film, plotted in terms of injection time, relating to a thermally grown oxide film, a nitrided oxide film (NO) nitrided for 60 seconds at 950° C., and a reoxidized film (ONO) reoxidized for 60 seconds at 1150° C. from the nitrided oxide film. The gate voltage was shifted in the positive direction due to trapping of the injected electrons, and was broken at the position indicated by the arrow in the drawing, from which the breakdown charge is evaluated. The breakdown charge of the reoxidized film (ONO) was extremely large, about 350 C/cm$^2$, and it was improved about 16 times as compared with that of thermally grown oxide film. Thus, the nitridation and reoxidation treatment by using lamp-heated furnace is very effective for enhancement of the breakdown charge, and it improves, for example, extremely the number of reloadable times in the EEPROM semiconductor device.

Figure 9A:
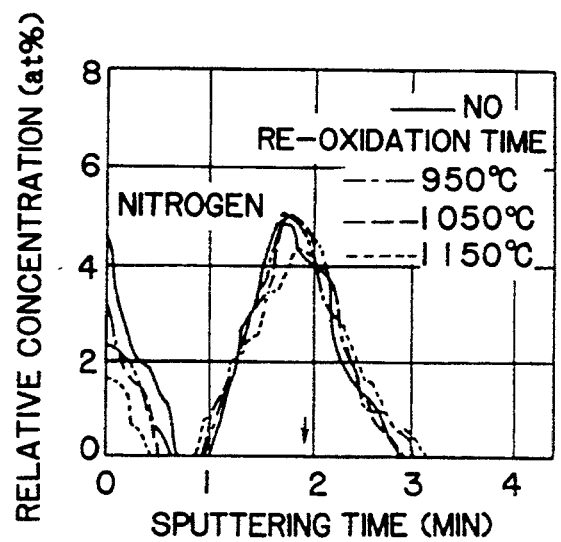
FIGS. 9A and 9B are distribution diagrams of nitrogen and oxygen in nitrided oxide film evaluated by Auger's spectral method.
Figure 9B:
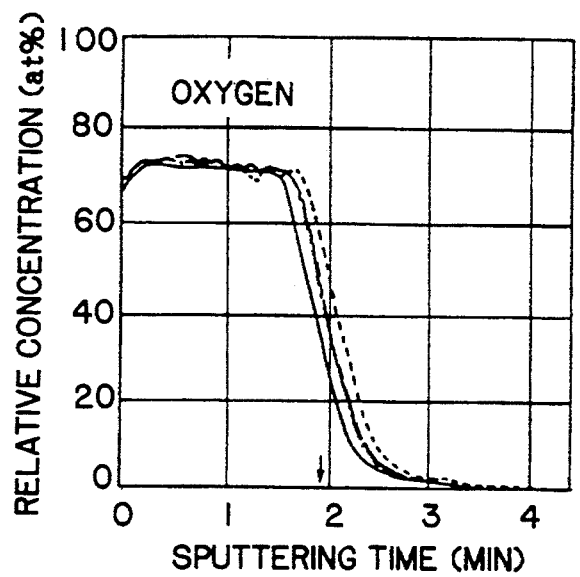

FIG. 9 shows the nitrogen and oxygen profiles in the insulating film evaluated by Auger's spectral method, relating to a nitrided oxide film (NO) nitrided for 60 seconds at 950° C., and reoxidized films reoxidized for 60 seconds at various temperature from the nitrided oxide film. In the nitrided oxide film (NO), a nitrided oxide layer of about 5 at. % was formed in the vicinity of the surface and in the vicinity of the interface of insulating film and semiconductor substrate. As the reoxidation temperature became higher, the quantity of nitrogen near the surface decreased, while the nitrogen profile in the vicinity of the interface of insulating film and semiconductor substrate rarely changed, and it is found that the nitrogen is stable in the vicinity of the interface of insulating film and semiconductor substrate if reoxidized. On the other hand, from the oxygen profile, especially by reoxidation treatment at 1150° C., it is known that a new oxide layer is formed in the vicinity of the interface of insulating film and semiconductor substrate, and that the interface of the insulating film and semiconductor substrate is shifted to the semiconductor substrate side. The thickness of this oxide layer is about 1 nm or less, and the decrease of capacity at this time is small, that is, 10% or less, and it is all right to form the thermally grown oxide film thinner initially by the portion of the thickness of this newly formed oxide layer.

Figure 10:
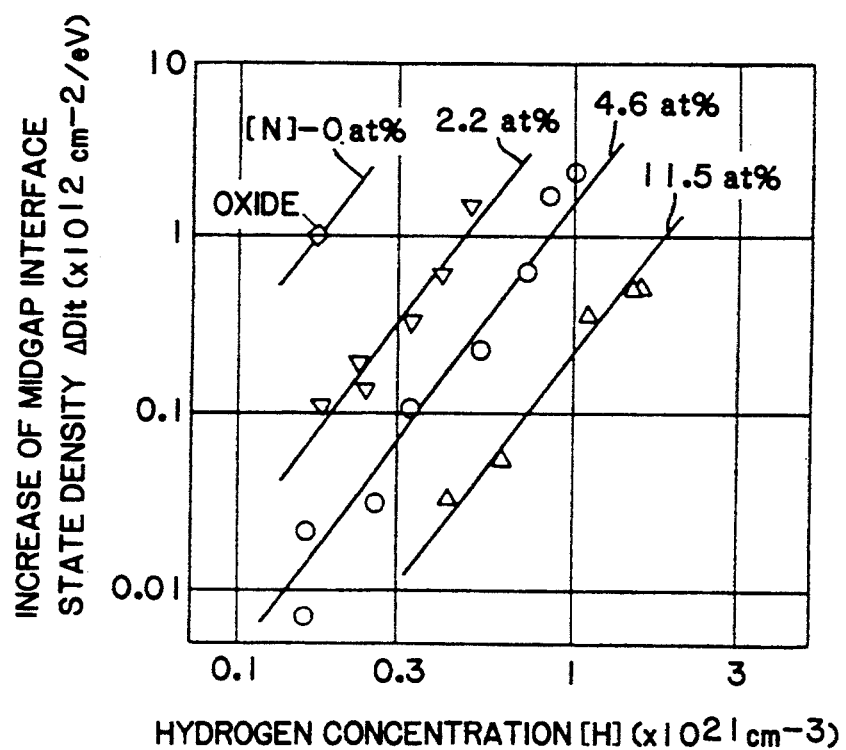
FIG. 10 is a characteristic diagram plotting the increment of interface state density when electrons of 0.1 coulomb/cm$^2$ in various nitrided oxide films and reoxidized films are injected into insulating film, in terms of hydrogen content in the insulating film evaluated by SIMS.

In order to understand the fact that the reoxidized nitrided oxide film is better in characteristics than the ordinary thermally grown oxide film in FIG. 6, the relation between the hydrogen concentration contained in the film and the interface state generated by electron injection is shown in FIG. 10. From the fact found in FIG. 9 that the nitrogen content in the silicon interface in the nitrided oxide film is almost unchanged by the subsequent reoxidation, it is possible to draw a contour line of identical interface nitrogen level in FIG. 10. In the diagram, the contour lines indicate the interface nitrogen levels of 0 at. % (thermally grown oxide film), 2.2, 4.6, 11.5 at. %.

It is known from the diagram that, at identical interface nitrogen level, that is, when same nitrided oxide films are reoxidized, the interface state generation is smaller when the hydrogen content is lower. Moreover, the contour line with great interface nitrogen level is always positioned lower in the diagram than that of the smaller interface nitrogen level. That is, comparing the insulating films having same hydrogen level, the interface state generation is smaller when the interface nitrogen level is greater.

From this finding it is found that there are two mechanisms for the generation of interface state by injection of electrons in the nitrided-oxide film system. One is the hydrogen content, and as its content is larger, the interface state generation is greater. The other is the interface nitrogen level, and when the level is higher, the interface state generation can be inhibited. Accordingly, in order to obtain a favorable insulating film small in interface state generation, it is required that the hydrogen content be smaller and that the interface nitrogen level be greater, and the process of reoxidation after nitridation mentioned above exactly satisfies these two conditions. Hence, the reoxidized nitrided oxide film possesses better characteristics than the ordinary oxide film.

Besides, from FIG. 10, the interface state level $\Delta D_{it}$ generated by injection of electrons into insulating film may be expressed as follows by the hydrogen concentration [H] contained in the film and the nitrogen concentration [N] in the interface of insulating film and substrate. That is, $$\Delta D_{it} = \frac{F \cdot [H]^m}{1 + K[N]^n} \quad (1)$$

where F, N are constants, and m, n are exponents.

In FIG. 10, supposing the experimental error to be ±20%, it is estimated that m=2±0.4, n=2.5±0.5, and k=2.0±0.4 (at. %)$^{-2}$. Besides, when the $D_{it}$ of ordinary oxide film is defined to be $D_{it}$(SiO$_2$), the condition for improvement by inhibiting the interface state generation as compared with the conventional thermally grown oxide film by nitridation and reannealing is $$\frac{\Delta D_{it}}{\Delta D_{it(SiO2)}} \leq 1 \quad (2)$$

Hence, from (1) and (2), it is known that the insulating film possessing [H] and [N] satisfying formula (3) below is the film having a smaller interface state generation and higher reliability as compared with the ordinary oxide film.

$$\left(\frac{[H]}{[H]_{ox}}\right)^m < 1 + K \cdot [N]^n \quad (3)$$

where [H]$_{ox}$ is the hydrogen concentration in an ordinary thermally grown oxide film.

Instead of reoxidation, the nitrided oxide film can be reannealed in inert gas.

Figure 11:
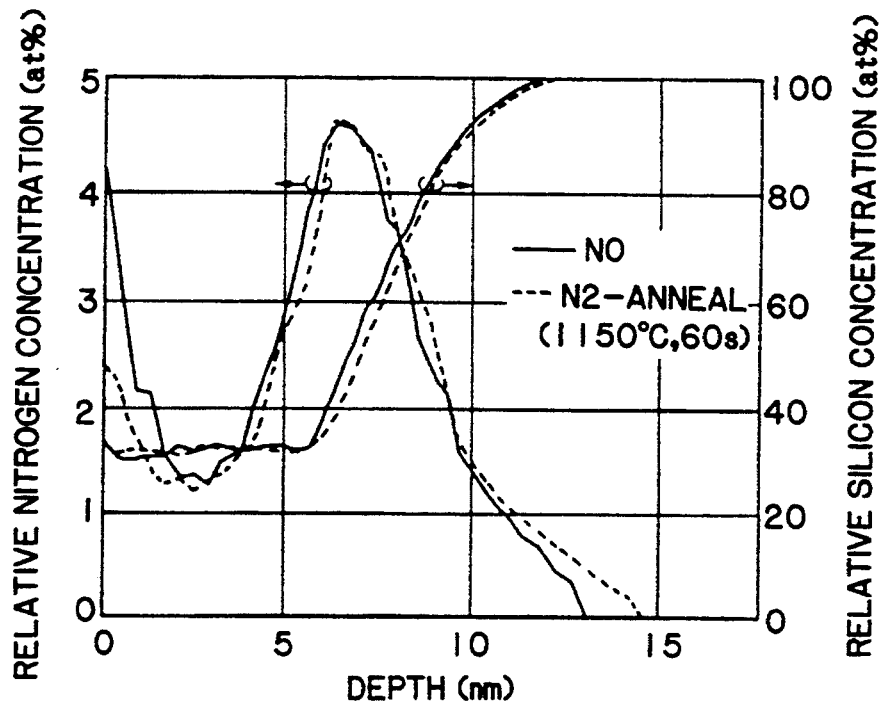
FIG. 11 is a distribution diagram of silicon and nitrogen in nitrided oxided film evaluated by Auger's spectral method and in insulating film obtained by reannealing it in nitrogen gas atmosphere.

FIG. 11 shows silicon and nitrogen profiles of the nitrided oxide film (NO) nitrided for 60 seconds at 950° C., and the insulating film of NO reannealed for 60 seconds at 1150° C., as evaluated by Auger's spectral method. Same as in the case of reoxidation, the nitrogen level near the silicon interface was not changed by reannealing. On the other hand, from the silicon profile, contrary to the increase of film thickness by reoxidation of the interface in the case of reoxidation, the thickness of the insulating film was not increased by reannealing in nitrogen gas. This fact means that the process is not exposed to the defects such as decrease of capacity as experienced in reoxidation, and it is found that application into semiconductor device is easier.

Furthermore, as a result of investigation of changes in the hydrogen content in the insulating film by reannealing in nitrogen gas according to SIMS analysis, it has been found that it has possesses an ability of removing the contained hydrogen as high as that of reoxidation process. For example, when the nitrided oxide film (NO) nitrided for 60 seconds at 950° C. was reannealed in nitrogen gas for 60 seconds at 1150° C., the hydrogen content of the produced insulating film was as low as about $2 \times 10^{20}$ cm$^{-3}$, which was nearly the same as the hydrogen content after reoxidation of the same NO for 60 seconds at 1150° C.

When the electron trapping characteristic of insulating film reannealed in nitrogen gas was investigated, the electron trapping density and interface state generation level were same as in the insulating film reoxidized in the same heating condition from the nitrided oxide film nitrided under the same conditions. For example, when electrons of 0.1 coulomb/cm$^2$ were injected into the insulating film reannealed in nitrogen gas for 60 seconds at 1150° C. from the nitrided oxide film (NO) nitrided for 60 seconds at 950° C., the shift of flat-band voltage and increment of interface state density were low, respectively 0.5 mV and $10^{10}$ cm$^{-2}$/eV, and these results were nearly same as when the same NO was reoxidized for 60 seconds at 1150° C. These results may be explained from the fact that the electron trapping density is governed by the hydrogen content as shown in FIG. 4 and that the interface state generation is governed by the hydrogen content and interface nitrogen level as shown in FIG. 10. In other words, reannealing in nitrogen gas was also effective to reduce the hydrogen content in the nitrided oxide film, the same as reoxidation, while the interface nitrogen level is not changed, so that a favorable insulating film of low electron trapping density and low interface state generation is obtained.

Hence, the reannealed nitrided oxide film obtained by reannealing nitrided oxide film in inert gas is very promising.

Incidentally, relating to redistribution of impurities, when reoxidizing for a long time of 10 minutes to 6 hours by using a conventional resistance-heated furnace, for example, in the condition proposed by Jayaraman et al. (IEDM, 1986), by heating for 4 hours at 950° C., the thickness of the phosphorus impurity layer formed on the semiconductor substrate for control of threshold voltage is increased by about 0.1 micron, and the electric characteristics of the semiconductor device is impaired.

Figure 12:
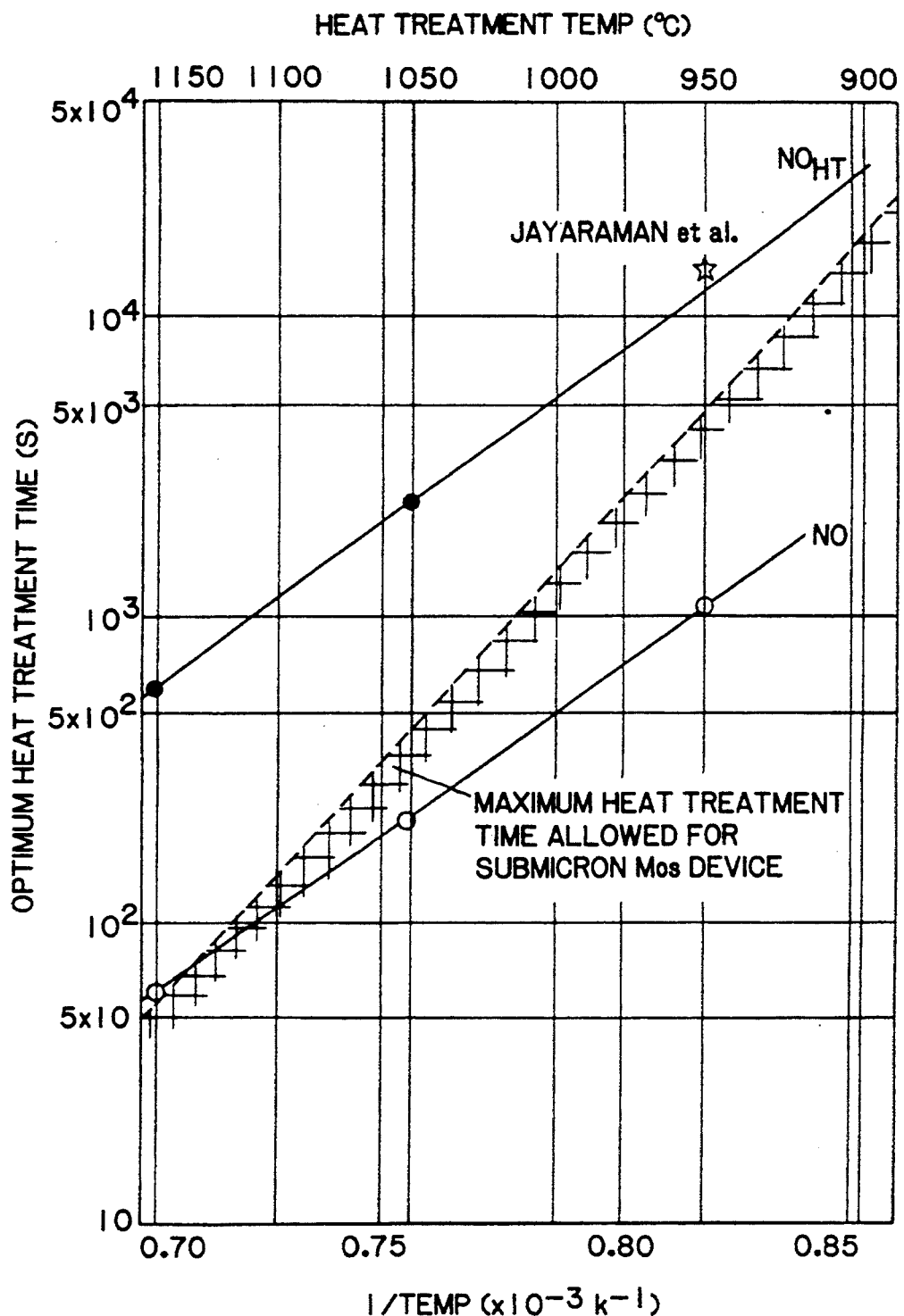
FIG. 12 is a characteristic diagram plotting the maximum heat treatment time allowed at each heat treatment temperature when the tolerance of increase of thickness of impurity layer of phosphorus and boron formed in a semiconductor substrate for control of threshold voltage is estimated at about 0.04 micron, and the reoxidation time at which optimum characteristics can be expected by reoxidizing the nitrided oxide film by nitrizing at 950° (NO) and 1150° C. ($NO_{HT}$) for 60 seconds, in terms of each heat treatment temperature.

Accordingly, estimating the allowable value of the increment of thickness of phosphorus and boron impurity layer formed on the semiconductor substrate for control of threshold voltage to be about 0.04 micron, the maximum heat treatment time allowed at each heat treatment temperature is plotted in FIG. 12. At the same time, the reoxidation time where the best characteristics can be expected by reoxidizing the nitrided oxide film nitrided for 60 seconds at 950° C. (NO) and 1150° C. (NO$_{HT}$) is also plotted in terms of various heat treatment temperatures. As a result, the film (NO) with a smaller degree of nitridation of nitrided oxide film is, as compared with the film (NO$_{HT}$) with a larger degree of nitridation, shorter in the reoxidation time where the best characteristics are expected, and is more advantageous for the redistribution of impurities, and also better characteristics can be expected by the portion of the smaller content of hydrogen in the original nitrided oxide film. When the nitriding condition of the NO (950° C., 60 seconds) is set further superficial, that is, lower in temperature or shorter in time, the reoxidation time where the best characteristic is expected becomes much shorter, and it is expected to be more beneficial for redistribution of impurities and electric characteristics.

Thus, according to this invention, by forming a nitrided oxide film by nitrizing in an ammonia atmosphere by using a lamp-heated furnace and then reannealing in a nitrogen or inert gas atmosphere, a reannealed nitrided oxide film possessing a lower electron trapping density can be obtained without inducing redistribution of impurities which poses problems in the reoxidation process for a long time using the resistance-heated furnace in the prior art.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

1. A method for fabricating a semiconductor device comprising the steps of:
    a) thermally growing a silicon oxide film containing hydrogen on a semiconductor substrate,
    b) forming a nitrided oxide film containing hydrogen by performing a light nitridation of said thermal silicon oxide film in a nitridizing atmosphere, whereby the concentration of nitrogen contained at the interface of said nitrided oxide film and the substrate is less than or equal to about 5 atomic % and hydrogen is introduced into said nitrided oxide film so that the hydrogen concentration of the nitrided oxide film is at a higher level than that of said thermal oxide film,
    c) forming an annealed nitrided oxide film by annealing said nitrided oxide film at an elevated temperature so that the hydrogen concentration of said nitrided oxide film formed in step b) is reduced to about the same level or lower than that in said thermal silicon oxide film of step a) and
    d) forming a gate electrode on said nitrided oxide film, wherein light nitridation in step b) is performed under a furnace time and temperature such that the concentration of hydrogen introduced in said nitrided oxide film can remain low so that the heat treatment time in step c) at a given temperature does not exceed an allowable time for fabrication of semiconductor devices without significant impurity redistribution, but is sufficient to reduce the hydrogen concentration introduced in said nitrided oxide film in step b) to about the same level or lower than as that in said thermal silicon oxide film of step a).

2. The method according to claim 1, wherein the nitridizing atmosphere in step b) contains ammonia ($NH_3$).

3. The method according to claim 1, wherein the annealing in step c) is performed in an oxidizing atmosphere.

4. The method according to claim 1, wherein the annealing in step c) is performed in an inert atmosphere.

5. The method according to claim 1, wherein the nitridation in step b) is performed using a rapid heating furnace.

6. The method according to claim 1, wherein the annealing in step c) is performed using a rapid heating furnace.

7. The method according to claim 1, wherein the nitridation in step b) and the annealing in step c) are performed using a rapid heating furnace.

8. The method according to claim 5, wherein the nitridation is performed at a temperature of 900° to 1150° C. for 15 to 60 seconds.

9. The method according to claim 6, wherein the annealing is performed at a temperature of 900° to 1150° C. for 15 to 60 seconds.

10. The method according to claim 1, wherein the annealing is performed at a temperature of 900° to 1150° C. for 15 to 60 seconds.

11. The method according to claim 1, when the heat treatment time in step c) at a given temperature does not exceed the allowable time for fabrication of submicron semiconductor devices without significant impurity redistribution.

12. The method according to claim 1, wherein the heat treatment time in step c) at a given temperature does not exceed the allowable time for fabrication of submicron semiconductor devices without increasing depth of impurity layer formed on the semiconductor substrate larger than about 0.4 $\mu$m.

* * * * *